US008976106B2

(12) United States Patent
So et al.

(10) Patent No.: US 8,976,106 B2
(45) Date of Patent: Mar. 10, 2015

(54) LIQUID CRYSTAL DISPLAY PANEL

(71) Applicant: LG Display Co., Ltd., Seoul (KR)

(72) Inventors: Byeong Seong So, Paju-si (KR); Joung Mi Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 2 days.

(21) Appl. No.: 14/044,515

(22) Filed: Oct. 2, 2013

(65) Prior Publication Data
US 2014/0118327 A1    May 1, 2014

(30) Foreign Application Priority Data

Oct. 29, 2012    (KR) .......................... 10-2012-0120413

(51) Int. Cl.
*G09G 3/36*    (2006.01)
*G11C 19/00*    (2006.01)
*G11C 19/28*    (2006.01)

(52) U.S. Cl.
CPC ............ *G09G 3/3696* (2013.01); *G09G 3/3677* (2013.01); *G11C 19/00* (2013.01); *G11C 19/28* (2013.01); *G11C 19/287* (2013.01); *G09G 2310/0286* (2013.01)
USPC ............................................ 345/103; 345/99

(58) Field of Classification Search
USPC ................................. 345/94, 95, 98–101, 103
See application file for complete search history.

(56) References Cited

U.S. PATENT DOCUMENTS

| | | | |
|---|---|---|---|
| 2006/0056267 A1* | 3/2006 | Kim et al. ................ | 365/230.06 |
| 2007/0164954 A1* | 7/2007 | Yang et al. ...................... | 345/88 |
| 2008/0036725 A1* | 2/2008 | Lee et al. ......................... | 345/100 |
| 2010/0053054 A1* | 3/2010 | Jeong et al. ..................... | 345/92 |
| 2011/0157263 A1* | 6/2011 | Kim et al. ...................... | 345/698 |
| 2012/0098807 A1* | 4/2012 | Lee et al. ....................... | 345/209 |
| 2012/0146969 A1* | 6/2012 | Sakamoto et al. ............. | 345/204 |
| 2012/0327057 A1* | 12/2012 | Sakamoto et al. ............. | 345/211 |
| 2013/0088480 A1* | 4/2013 | Hong et al. .................... | 345/212 |

* cited by examiner

*Primary Examiner* — Ricardo L Osorio
(74) *Attorney, Agent, or Firm* — Brinks Gilson & Lione

(57) ABSTRACT

An LCD panel being driven in an overlapping drive mode by applying a gate high voltage during n horizontal synchronous intervals is disclosed. The LCD panel includes: a plurality of gate lines; and a gate driver configured to include a plurality of stages connected to the plurality of gate lines. The plurality of stages are grouped in a plurality of stage groups each including n stages. Odd-numbered stage groups each allows the n stages to be arranged in a Z shape with having a display area therebetween. Even-number stage groups each allows the n states to be arranged in an inverse-Z shape with having the display area therebetween.

20 Claims, 8 Drawing Sheets

LIQUID CRYSTAL DISPLAY PANEL

The present application claims priority to Korean Patent Application No. 10-2012-0120413, filed on Oct. 29, 2012, the entirety of which is hereby incorporated by reference herein.

BACKGROUND

1. Field of the Disclosure

The present application relates to a liquid crystal display panel.

2. Description of the Related Art

With the development of an information society, the requirements for display devices used to display images have been increased in a variety of manners. As such, flat panel display devices being thinner and lighter weight compared to cathode ray tubes (CRTs) of the related art are being actively researched and manufactured. The flat panel display devices include liquid crystal display (LCD) devices, plasma display devices (PDPs), organic light emitting display (OLED) devices and so on. Among the flat panel display devices, the LCD devices are now widely being used because of features such as small size, light weight, slimness and low power drive.

The LCD device re-aligns liquid crystal molecules in response to data voltages applied through thin film transistors and controls transmittance of each pixel region, in order to display an image. A plurality of gate lines are formed on an LCD panel provided with the thin film transistors. The thin film transistors may be turn-on/off by gate voltages on the respective gate lines.

The gate lines receive the gate voltages from a gate driver. In a recently proposed LCD device of the gate-in-panel (GIP), the gate driver is formed on the LCD panel in order to reduce manufacturing costs and minimize power consumption. Such a gate driver may be driven in a non-overlapping drive mode and an overlapping drive mode.

FIG. 1 is a waveform diagram illustrating a non-overlapping drive mode of the related art. FIG. 2 is a waveform diagram illustrating an overlapping drive mode of the related art.

Referring to FIG. 1, a gate high voltage is sequentially applied to gate lines in synchronization with first and second clock signals CLK1 and CLK2 which maintain alternately with each other a high level in a single horizontal interval. More specifically, the gate high voltage is applied to the first gate line GL1 in synchronization with the first clock signal CLK1. Also, the gate high voltage is applied to the second gate line GL2 in synchronization with the second clock signal CLK2.

Referring to FIG. 2, the gate high voltage is applied to each of the gate lines in two horizontal intervals. The gate high voltage applied to each of the gate lines is synchronized with first and second clock signals CLK1 and CLK2 which each maintain the high level in two horizontal intervals.

The second clock signal CLK2 has a delayed phase of a single horizontal synchronous interval in comparison with the first clock signal CLK1. As such, the first and second clock signals CLK1 and CLK2 overlap with each other by a single horizontal synchronous interval.

In accordance therewith, the width of the gate high voltage applied to the first gate line GL1 partially overlaps with that of the gate high voltage applied to the second gate line GL2. This results from the fact that the gate high voltage on the first gate line GL1 is synchronized with a high level interval of the first clock signal CLK1 and the gate high voltage on the second gate line GL2 is synchronized with the high level interval of the second clock signal CLK2. In other words, the gate high voltage on the first gate line GL1 overlaps with that on the second gate line GL2 by a single horizontal synchronous interval. In this manner, the overlapping drive mode enables the gate high voltages applied to the gate lines to partially overlap with one another.

The overlapping drive mode applies the gate high voltage during a longer interval, compared to the non-overlapping drive mode. As such, an effect of pre-charging the gate lines may be provided. The pre-charging effect may prevent problems due to the delay of the rising time of the gate pulse which is caused by the resistance-capacitance delay on the gate line.

However, it is difficult for the overlapping drive mode to solve problems which are caused by the delay of the falling time of the gate pulse. Due to this, distortion of signals and longitudinal line defects may be generated.

BRIEF SUMMARY

Accordingly, embodiments of the present application are directed to an LCD panel that substantially obviates one or more of problems due to the limitations and disadvantages of the related art.

The embodiments are to provide an LCD panel that is adapted to prevent a delay of the falling time of the gate pulse and enhance picture quality.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to an aspect of the present invention, there is provided a display panel, the display panel comprising: a plurality of gate lines; a first clock line and a second clock line; and a gate driver configured to include a plurality of stages connected to the plurality of gate lines, wherein the plurality of stages are grouped into a plurality of first numbered stages that are connected to the first clock line on one end and a corresponding compensation transistor on another end such that a display area is positioned between a first numbered stage and a corresponding compensation transistor, and a plurality of second numbered stages that are connected to the second clock line on one end and a corresponding compensation transistor on another end such that a display area is positioned between a second numbered stage and a corresponding compensation transistor.

According to another aspect of the present invention, there is provided a method of driving a display panel, comprising: configuring a gate driver to include a plurality of stages connected to a plurality of gate lines, wherein the plurality of stages are grouped into a plurality of first numbered stages and a plurality of second numbered stages; driving the first numbered stages, the first numbered stages including a first clock line on one end and a corresponding compensation transistor on another end wherein a display area is positioned between a first numbered stage and a corresponding compensation transistor, and driving the second numbered stages, the second numbered stages including a second clock line on one end and a corresponding compensation transistor on another end such wherein a display area is positioned between a second numbered stage and a corresponding compensation transistor.

Other systems, methods, features and advantages will be, or will become, apparent to one with skill in the art upon examination of the following figures and detailed description.

It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
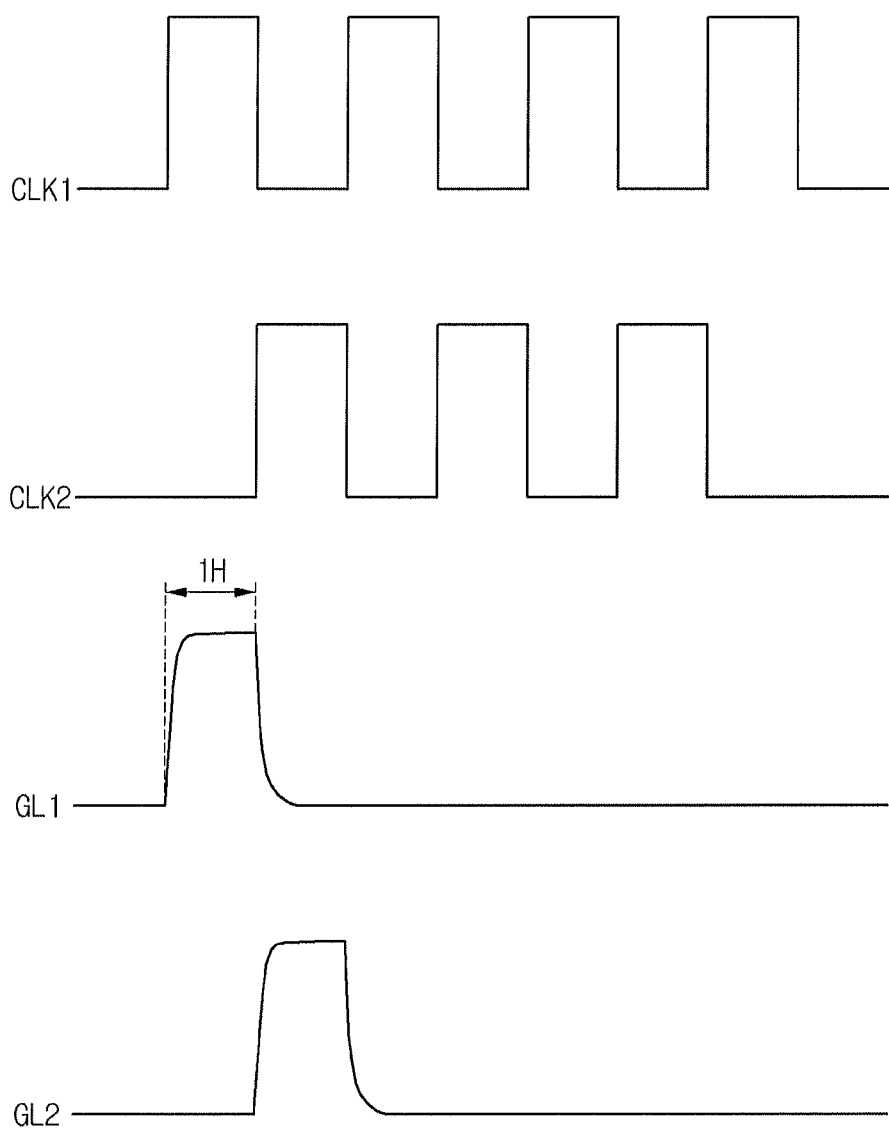
FIG. 1 is a waveform diagram illustrating a non-overlapping drive mode of the related art.
Figure 2:
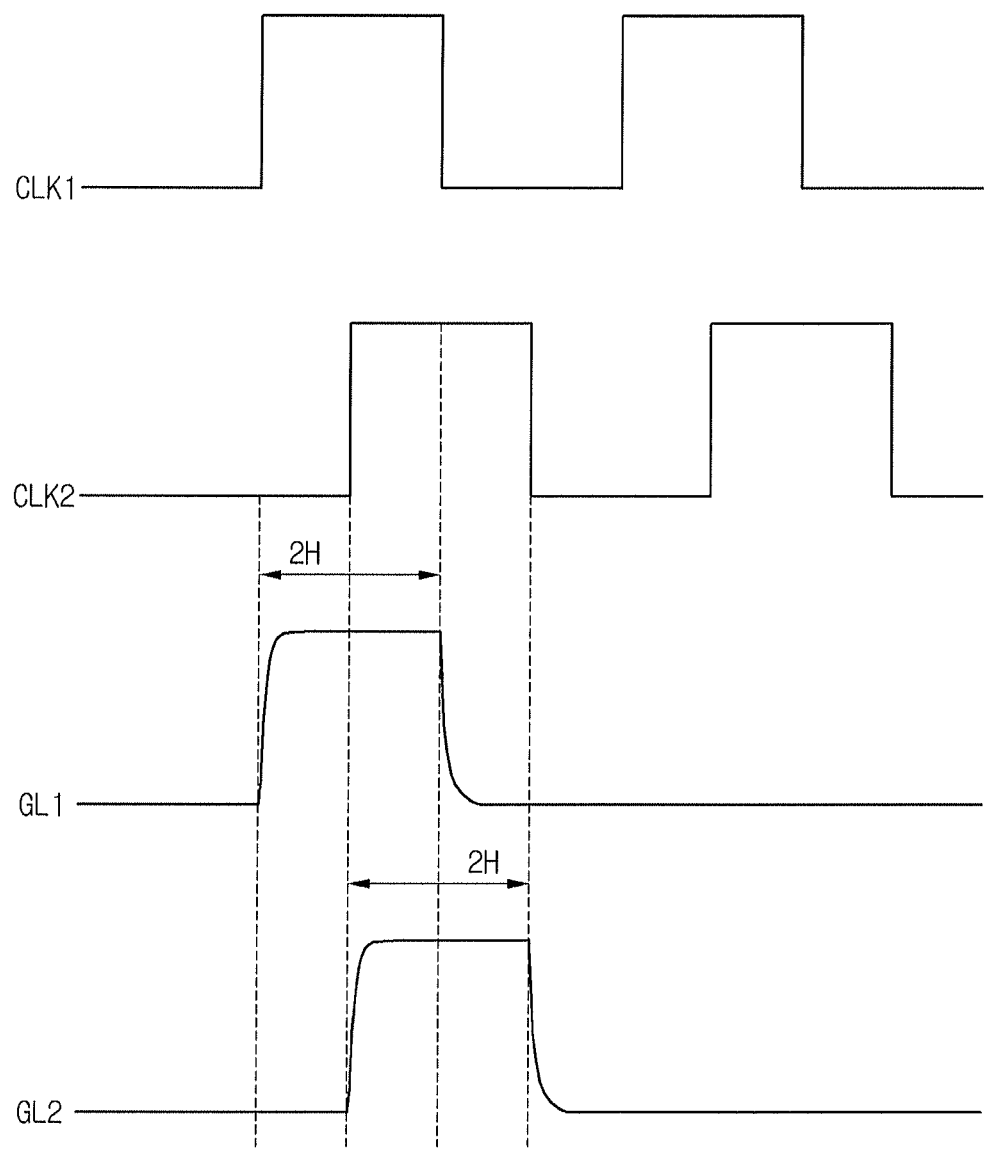
FIG. 2 is a waveform diagram illustrating an overlapping drive mode of the related art.

In the present disclosure, it will be understood that when an element, such as a substrate, a layer, a region, a film, or an electrode, is referred to as being formed "on" or "under" another element in the embodiments, it may be directly on or under the other element, or intervening elements (indirectly) may be present. The term "on" or "under" of an element will be determined based on the drawings.

The present invention as described herein may be embodied in a number of different forms. Not all of the depicted components may be required, however, and some implementations may include additional, different, or fewer components from those expressly described in this disclosure. Variations in the arrangement and type of the components may be made without departing from the spirit or scope of the claims as set forth herein.

Reference will now be made in detail to the present embodiments, examples of which are illustrated in the accompanying drawings. In the drawings, the sizes and thicknesses of elements may be exaggerated, omitted or simplified for clarity and convenience of explanation, but they do not mean the practical sizes of elements.

An LCD panel according to a first general aspect of the present embodiment may be driven in an overlapping drive mode by applying a gate high voltage during n horizontal synchronous intervals. This LCD panel may include: a plurality of gate lines; and a gate driver configured to include a plurality of stages connected to the plurality of gate lines. The plurality of stages are grouped in a plurality of stage groups each including n stages. Odd-numbered stage groups each allows the n stages to be arranged in a Z shape with having a display area therebetween. Even-number stage groups each allows the n states to be arranged in an inverse-Z shape with having the display area therebetween.

The liquid crystal display panel may further include a plurality of compensation transistors connected to the plurality of gate lines and configured to apply a gate low voltage to the gate lines.

A kth compensation transistor of the plural compensation transistors may be turned on/off by a voltage on a (k+n)th gate line.

The compensation transistor may be disposed opposite to the stage with having the display area therebetween.

A gate electrode of the kth compensation transistor may be electrically connected to the (k+n)th gate line in an adjacent region to a (k+n)th stage.

The gate driver may include first and second gate drivers disposed in both sides of the display area.

The first gate driver may include: odd-numbered stages and even-numbered compensation transistors within the odd-numbered stage groups; and even-numbered stages and odd-numbered compensation transistors within the even-numbered stage groups.

The second gate driver may include: even-numbered stages and odd-numbered compensation transistors within the odd-numbered stage groups; and odd-numbered stages and even-numbered compensation transistors within the even-numbered stage groups.

The number "n" may be a multiple of 2.

The first gate driver may include: a first clock line used to transfer a clock signal; a first voltage line used to transfer the gate high voltage; and a second voltage line used to transfer the gate low voltage.

The second gate driver may include: a second clock line used to transfer a clock signal; a first voltage line used to transfer the gate high voltage; and a second voltage line used to transfer the gate low voltage.

An LCD panel according to a second general aspect of the present embodiment may be driven in an overlapping drive mode by applying a gate high voltage during two horizontal synchronous intervals. This LCD panel includes: a plurality of gate lines; and a gate driver configured to include a plurality of stages connected to the plurality of gate lines. The plurality of stages includes (4k−3)th and (4k−2)th stages arranged alternately with each other and with having a display area therebetween, and (4k−1) th and (4k) th stages arranged alternately with each other and with having the display area therebetween.

The (4k−3)th and (4k−2)th stages are arranged in left and right sides of the display area. The (4k−1)th and (4k)th stages are arranged in the right and left sides of the display area.

The liquid crystal display panel may further include a plurality of compensation transistors connected to the plurality of gate lines and configured to apply a gate low voltage to the gate lines.

An nth compensation transistor of the plural compensation transistors may be turned on/off by a voltage on a (n+2)th gate line.

The compensation transistor may be disposed opposite to the stage with having the display area therebetween.

A gate electrode of the nth compensation transistor may be electrically connected to the (n+2)th gate line in an adjacent region to a (k+n)th stage.

The gate driver may include first and second gate drivers disposed in both sides of the display area.

The first gate driver may include: the (4k−3)th and (4k)th stages; and the (4k−2)th and (4k−1)th compensation transistors among the plurality of compensation transistors.

The second gate driver may include: the (4k−2)th and (4k−1)th stages; and the (4k−3)th and (4k)th compensation transistors among the plurality of compensation transistors.

Figure 3:
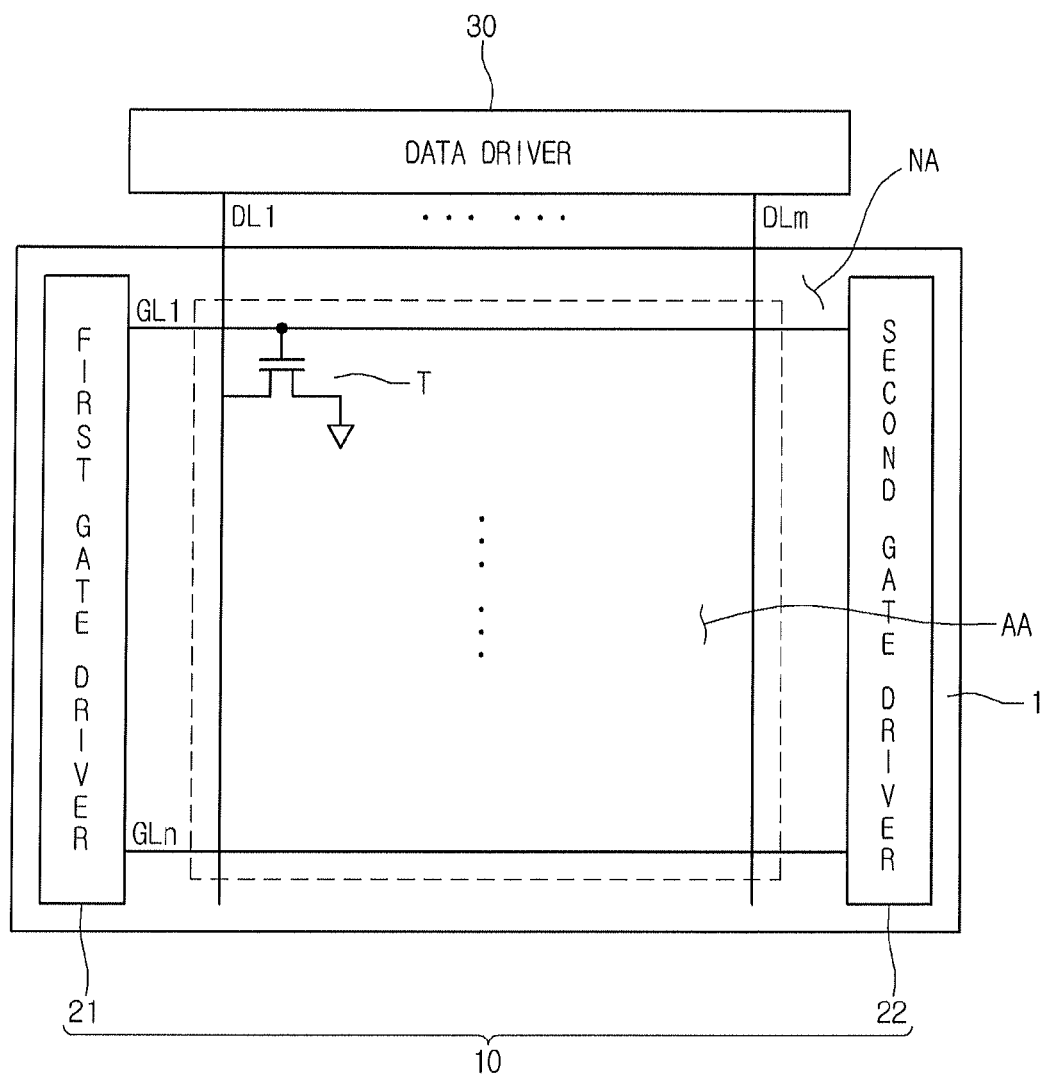
FIG. 3 is a block diagram showing an LCD device according to an embodiment of the present disclosure.

FIG. 3 is a block diagram showing an LCD device according to an embodiment of the present disclosure.

Referring to FIG. 3, the LCD device according to an embodiment of the present disclosure includes an LCD panel 1, a gate driver 10 and data drivers 30. The gate driver 10 is formed on the LCD panel 1.

A plurality of gate lines GL1~GLn are formed on the LCD panel 1. Also, a plurality of data lines DL1~DLm are formed on the LCD panel 1 in a direction crossing the plurality of gate lines GL1~GLn.

The plurality of gate lines GL1~GLn and the plurality of data lines DL1~DLm crossing each other define a plurality of pixel regions. A plurality of thin film transistors T may be connected to the plurality of gate lines GL1~GLn and the plurality of data lines DL1~DLm.

Each of the thin film transistors may include a gate electrode, a source electrode and a drain electrode. The gate electrode may be connected to one of the gate lines GL1~GLn, and the source electrode may be connected to one of the data lines DL1~DLm. The gate electrode may be formed in a single body united with the gate line GL. The source electrode may be formed in a single body united with the data line DL. The drain electrode may be connected to a pixel electrode within the pixel region.

The LCD panel 1 may be defined into a display area AA and a non-display area NA. The display area AA may be used to display images. The non-display area NA does not display any image. The non-display area NA is positioned outside the display area AA.

The gate driver 10 may be formed on the non-display area NA. Also, the data driver 30 may be formed on the non-display area NA.

The gate driver 10 may include first and second gate drivers 21 and 22. The first gate driver 21 may be positioned in a side edge of the non-display area NA. The second gate driver 22 may be positioned in the other edge of the non-display area NA. In other words, the first and second gate drivers 21 and 22 may be formed on the non-display area NA in such a manner as to face to each other.

The first gate driver 21 may be electrically connected to one end of the plural gate lines GL1~GLn. The second gate driver 22 may be electrically connected to the other end of the plurality of gate lines GL1~GLn.

The gate driver 10 may apply gate pulses to the plurality of gate lines GL1~GLn. The first gate driver 21 may apply the gate pulses to one portion of the gate lines GL1~GLn positioned in one domain of the display area AA which is adjacent to the first gate driver 21 on the basis of the central axis of the display area AA. The second gate driver 22 may apply the gate pulses to the other portion of the gate lines GL1~GLn positioned in the other domain of the display area AA which is adjacent to the second gate driver 22 on the basis of the central axis of the display area AA. In other words, the first and second gate drivers 21 and 22 may apply the gate pulses to the portions of the plural gate lines GL1~GLn which are divided according to the domains of the display area AA, respectively.

In this manner, the gate driver 10 is formed in both sides of the plural gate lines GL1~GLn and applies the gate pulses to the plural gate lines GL1~GLn. As such, a resistance-capacitance delay caused by a line resistance in a large-sized display device may be minimized. Therefore, image quality of the large-sized display device may be enhanced.

The data driver 30 may be electrically connected to the plurality of data lines DL1~DLm. The data driver 30 may apply data voltages to the thin film transistors T through the data lines DL1~DLm, in synchronization with a time point at which the transistors T are turned-on by the gate pulse. Such a data driver 30 may be positioned in the non-display area NA.

Figure 4:
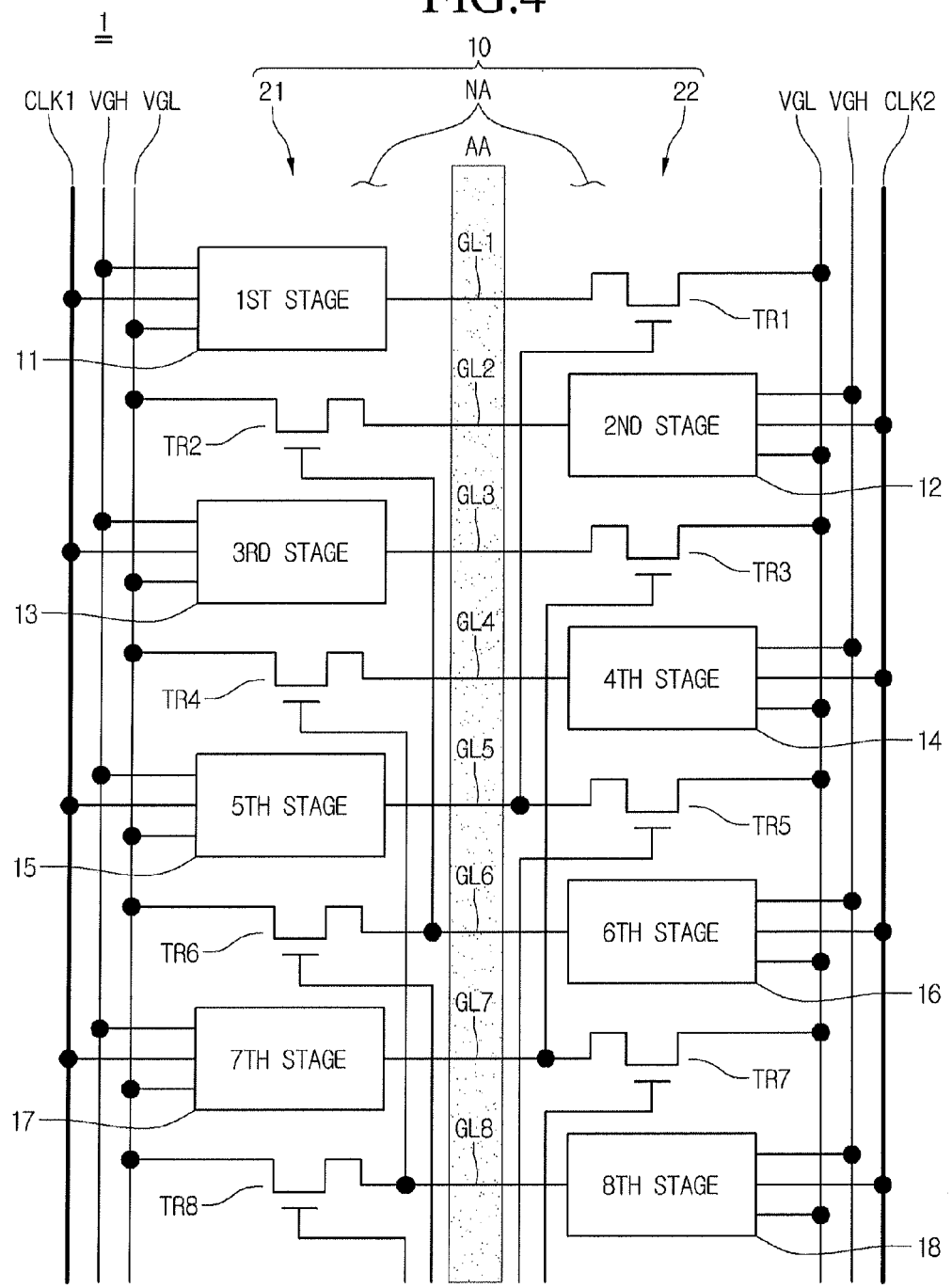
FIG. 4 is a detailed circuit diagram showing a gate driver of the LCD device according to a first embodiment of the present disclosure.

FIG. 4 is a detailed circuit diagram showing a gate driver of the LCD device according to a first embodiment of the present disclosure.

Referring to FIG. 4, the LCD panel 1 of the LCD device according to a first embodiment of the present disclosure may be defined into the display area AA and the non-display area NA. The non-display area NA may be positioned outside the display area AA.

For convenience of explanation, the display area AA is shown to have a smaller size compared to the non-display area NA, in the drawing. However, the present embodiment is not limited to this.

The gate driver 10 may be formed on the non-display area NA. The gate driver 10 includes the first and second gate drivers 21 and 22. The gate driver 10 includes a plurality of stages. For example, the gate driver 10 may include first through eighth stages 11 through 18. Although the gate driver 10 with the eight stages is shown in the drawing, the number of stages depends on the number of gate lines. As such, the number of stages is not limited to this.

The first gate driver 21 includes odd-numbered stages. For example, the first gate driver 21 may include first, third, fifth and seventh stages 11, 13, 15 and 17. Also, the first gate driver 21 may include a first clock line CLK1, a first voltage line VGH and a second voltage line VGL.

Moreover, the first gate driver 21 may include even-numbered compensation transistors. For example, the first gate driver 21 may include second, fourth, sixth and eighth compensation transistors TR2, TR4, TR6 and TR8.

The first clock line CLK1 may be used to transfer a clock signal. Although only the first clock line CLK1 is shown in the drawing, a plurality of clock lines used to transfer clock signals with different frequencies from one another may be included in the first gate driver 21.)

The first voltage line VGH may be used to transfer a first voltage, and the second voltage line VGL may be used to transfer a second voltage. The first and second voltage may be set to be different levels from each other. For example, the first voltage may become a gate high voltage and the second voltage may become a gate low voltage.

The second gate driver 22 includes even-numbered stages. For example, the second gate driver 22 may include second, fourth, sixth and eighth stages 12, 14, 16 and 18. Also, the second gate driver 22 may include a second clock line CLK2, the first voltage line VGH and the second voltage line VGL.

Further, the second gate driver 22 may include odd-numbered compensation transistors. For example, the second gate driver 22 may include first, third, fifth and seventh compensation transistors TR1, TR3, TR5 and TR7.

The second clock line CLK2 may be used to transfer a clock signal. Although only the second clock line CLK1 is shown in the drawing, a plurality of clock lines used to transfer clock signals with different frequencies from one another may be included in the second gate driver 22.

The first voltage line VGH may be used to transfer the first voltage, and the second voltage line VGL may be used to transfer the second voltage. The first and second voltage may be set to be different levels from each other. For example, the first voltage may become the gate high voltage and the second voltage may become the gate low voltage.

The first, third, fifth and seventh stages 11, 13, 15 and 17 may be electrically connected to the first clock line CLK1, the first voltage line VGH and the second voltage line VGL.

The second, fourth, sixth and eighth stages 12, 14, 16 and 18 may be electrically connected to the second clock line CLK2, the first voltage line VGH and the second voltage line VGL.

Each of the stages 11~18 may generate a gate pulse selectively using the gate high voltage and the gate low voltage in response to the clock signal on the clock line CLK. Also, each of the stages 11~18 may apply the generated gate pulse to the respective gate line GL.

The first stage 11 may be electrically connected to the first gate line GL1. The second stage 12 may be electrically connected to the second gate line GL2. The third stage 13 may be electrically connected to the third gate line GL3. The fourth stage 14 may be electrically connected to the fourth gate line GL4. The fifth stage 15 may be electrically connected to the fifth gate line GL5. The sixth stage 16 may be electrically connected to the sixth gate line GL6. The seventh stage 17 may be electrically connected to the seventh gate line GL7. The eighth stage 18 may be electrically connected to the eighth gate line GL8.

The first gate line GL1 may be electrically connected to the first stage 11 and the second voltage line VGL of the second gate driver 22. A drain electrode of the first compensation transistor TR1 may be connected to the second voltage line VGL of the second gate driver 22. A source electrode of the first compensation transistor TR1 may be electrically connected to one end of the first gate line GL1 adjacent to the second voltage line VGL of the second gate driver 22. A gate electrode of the first compensation transistor TR1 may be electrically connected to the fifth gate line GL5. More specifically, the gate electrode of the first compensation transistor TR1 may be electrically connected to the one end of the fifth gate line GL5 adjacent to the second voltage line VGL of the second gate driver 22. A conductive line connecting the gate electrode of the first compensation transistor TR1 and the fifth gate line GL5 may be formed in a different layer from the gate lines GL1~GL8, and electrically isolated from the gate lines GL1~GL8.

The second gate line GL2 may be electrically connected to the second stage 12 and the second voltage line VGL of the first gate driver 21. A drain electrode of the second compensation transistor TR2 may be connected to the second voltage line VGL of the first gate driver 21. A source electrode of the second compensation transistor TR2 may be electrically connected to the other end of the second gate line GL2 adjacent to the second voltage line VGL of the first gate driver 21. A gate electrode of the second compensation transistor TR2 may be electrically connected to the sixth gate line GL6. More specifically, the gate electrode of the second compensation transistor TR2 may be electrically connected to the other end of the sixth gate line GL6 adjacent to the second voltage line VGL of the first gate driver 21.

The third gate line GL3 may be electrically connected to the third stage 13. Also, the third gate line GL3 may be electrically connected to the second voltage VGL of the second gate driver 22 via the third compensation transistor TR3.

The fourth gate line GL4 may be electrically connected to the fourth stage 14. Also, the fourth gate line GL4 may be electrically connected to the second voltage VGL of the first gate driver 21 via the fourth compensation transistor TR4.

The fifth gate line GL5 may be electrically connected to the fifth stage 15. Also, the fifth gate line GL5 may be electrically connected to the second voltage VGL of the second gate driver 22 via the fifth compensation transistor TR5.

The sixth gate line GL6 may be electrically connected to the sixth stage 16. Also, the sixth gate line GL6 may be electrically connected to the second voltage VGL of the first gate driver 21 via the sixth compensation transistor TR6.

The seven gate line GL7 may be electrically connected to the seventh stage 17. Also, the seventh gate line GL7 may be electrically connected to the second voltage VGL of the second gate driver 22 via the seventh compensation transistor TR7.

The eighth gate line GL8 may be electrically connected to the eighth stage 18. Also, the eighth gate line GL8 may be electrically connected to the second voltage VGL of the first gate driver 21 via the eighth compensation transistor TR8.

Each of the compensation transistors TR1~TR8 may be turned-on/off by a signal of the different gate line. For example, nth compensation transistor may be turned-on/off by a signal on (n+4)th gate line. This results from the fact the nth compensation transistor may be electrically connected to the (n+4)th gate line.

Figure 5:
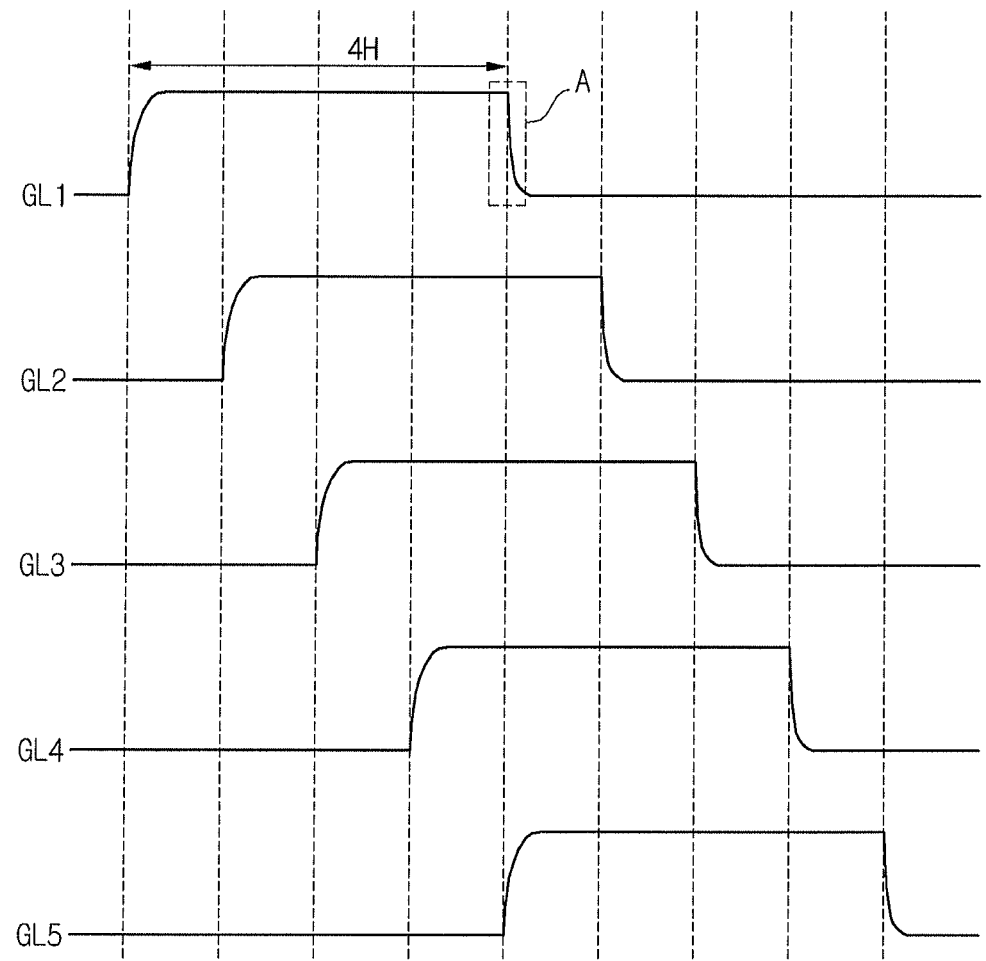
FIG. 5 is a waveform diagram showing gate pulses output from the gate driver of FIG. 4.

FIG. 5 is a waveform diagram showing gate pulses output from the gate driver of FIG. 4.

Referring to FIG. 5, the gate driver 10 of the LCD device according to a first embodiment of the present disclosure applies the gate high voltage to each of the gate lines during four horizontal synchronous intervals. Also, the gate driver 10 sequentially applies the gate high voltage to the gate lines GL1~GL8 with having a time difference corresponding to a signal horizontal synchronous interval. As such, the gate lines GL1~GL8 may be driven in an overlapping drive mode with having the time difference of a single horizontal synchronous interval therebetween.

The first compensation transistor TR1 is turned on by the gate high voltage applied from the fifth gate line GL5 and transfers the gate low voltage on the second voltage line VGL to the first gate line GL1. In other words, the gate low voltage is applied to the first gate line GL1 in synchronization with the gate high voltage on the fifth gate line GL5. As such, the falling time of the gate pulse proceeding after a lapse of four horizontal synchronous intervals may be reduced. More specifically, the delay of the falling time due to the resistance-capacitance delay, by which the first stage 11 applies the gate low voltage to the first gate line GL1 after supplying the gate high voltage for four horizontal synchronous intervals, may be reduced by applying the gate low voltage to the first gate line GL through the first compensation transistor TR1.

In this manner, the gate low voltage may be applied to the first gate line GL1 in synchronization with the gate high voltage on the fifth gate line GL5. Similarly, the gate low voltage may also be applied to each of the gate lines in synchronization with the gate high voltage on different gate line. In other words, the gate low voltage may be applied to the nth gate line in synchronization with a timing that the gate high voltage is applied to the (n+4) gate line. Therefore, the falling time of the gate pulse may be reduced.

Moreover, the gate driver 10 allows the stage and the compensation transistor to be connected to both ends of each gate line, unlike other configurations that connect two stages to both ends of each gate line. As such, the number of stages may be reduced. In accordance therewith, the sizes of the gate driver and the non-display area may be reduced. As a result, a narrow bezel may be realized.

Figure 6:
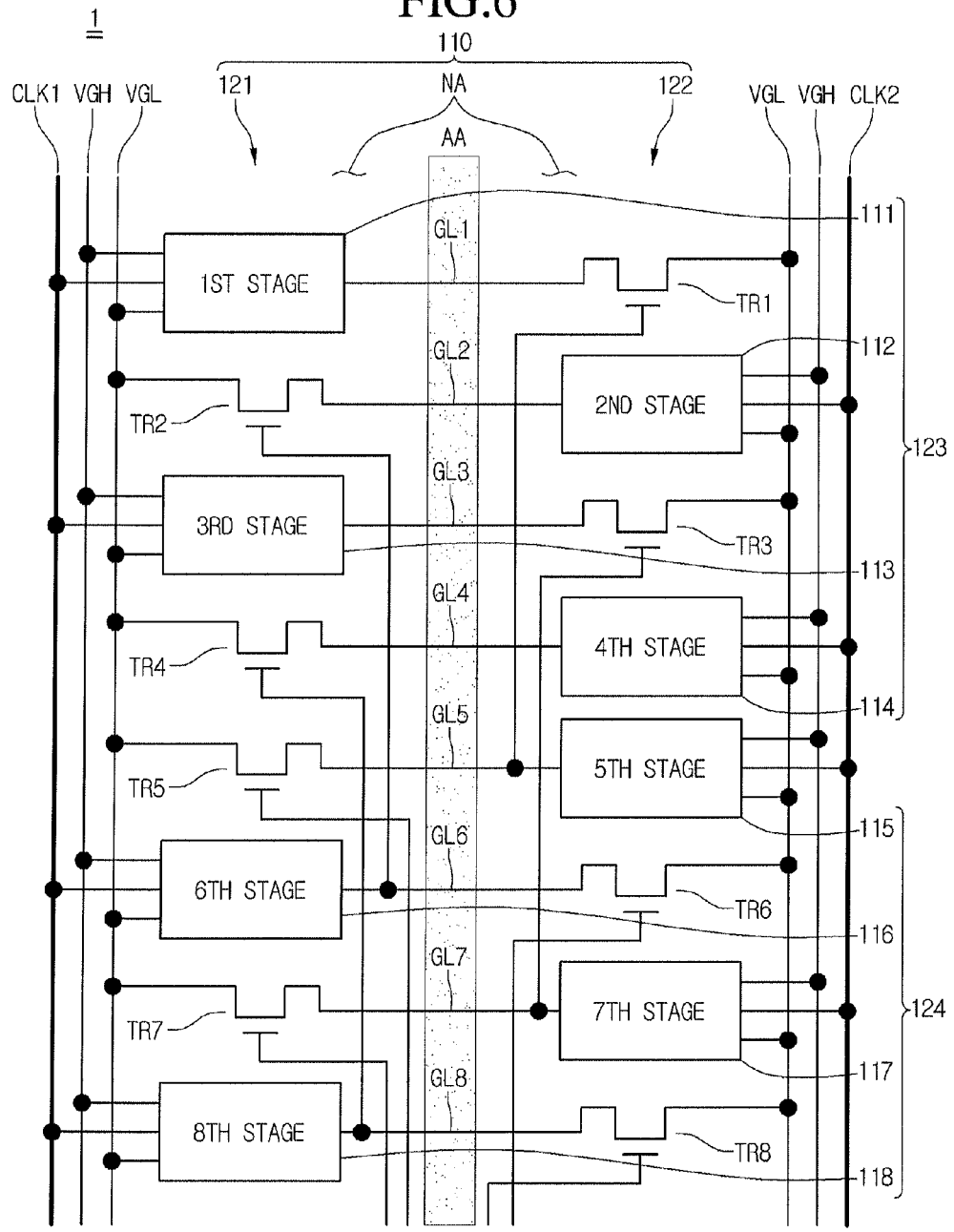
FIG. 6 is a detailed circuit diagram showing a gate driver of the LCD device according to a second embodiment of the present disclosure.

FIG. 6 is a detailed circuit diagram showing a gate driver of the LCD device according to a second embodiment of the present disclosure.

The gate driver of the second embodiment has the same configuration as that of the first embodiment with the exception of positional alternation of the stages and the compensation transistors. As such, the description of the second embodiment overlapping with the first embodiment will be omitted.

Referring to FIG. 6, the LCD panel 1 of the LCD device according to a second embodiment of the present disclosure may be defined into the display area AA and the non-display area NA. The non-display area NA may be positioned outside the display area AA.

The gate driver 110 may be formed on the non-display area NA. The gate driver 110 includes the first and second gate drivers 121 and 122. The gate driver 110 may include first through eighth stages 111 through 118.

The first through fourth stages 111 through 114 may configure a first stage group 123, and the fifth through eighth stages 115 through 118 may configure a second stage group 124. The first stage group 123 may have a stage arrangement of a Z shape, and the second stage group 124 may have a stage arrangement of an inverse Z shape.

The first gate driver 121 may include odd-numbered stages within the first stage group 123 and even-numbered stages within the second stage group 124. For example, the first gate driver 121 includes the first, third, sixth and eighth stages 111, 113, 116 and 118. The first gate driver 121 may further include the first clock line CLK1, the first voltage line VGH and the second voltage line VGL.

The second gate driver 122 may include even-numbered stages within the first stage group 123 and odd-numbered stages within the second stage group 124. For example, the second gate driver 122 includes the second, fourth, fifth and seventh stages 112, 114, 115 and 117. The second gate driver 122 may further include the second clock line CLK2, the first voltage line VGH and the second voltage line VGL.

A plurality of compensation transistors may be formed in regions opposite to the plurality of stages. For example, the second, fourth, fifth and seventh compensation transistors TR2, TR4, TR5 and TR7 may be formed with the first gate driver 121. The first, third, sixth and eighth compensation transistors TR1, TR3, TR6 and TR8 may be formed within the second gate driver 122. In other words, the first through fourth compensation transistors TR1 through TR4 opposite to the first stage group 123 may be arranged in the inverse Z shape, and the fifth through eighth compensation transistors TR5 through TR8 opposite to the second stage group 124 may be arranged in the Z shape.

The first, third, sixth and eight stages 111, 113, 116 and 118 may be electrically connected to the first clock line CLK1, the first voltage line VGH and the second voltage line VGL.

The second, fourth, fifth and seventh stages 112, 114, 115 and 117 may be electrically connected to the second clock line CLK2, the first voltage line VGH and the second voltage line VGL.

The first compensation transistor TR1 may be turned-on/off by the signal on the fifth gate line GL5. To this end, the gate electrode of the first compensation transistor TR1 may be electrically connected to the fifth gate line GL5. More specifically, the gate electrode of the first compensation transistor TR1 may be electrically connected to one end of the fifth gate line GL5 in an adjacent region to the fifth stage 115.

The first stage group 123 has a stage arrangement of a Z shape, and the second stage group 124 may has a stage arrangement of an inverse Z shape. Also, a gate electrode of nth compensation transistor may be electrically connected to (n+4)th gate line in an adjacent region to (n+4)th stage.

Figure 7:
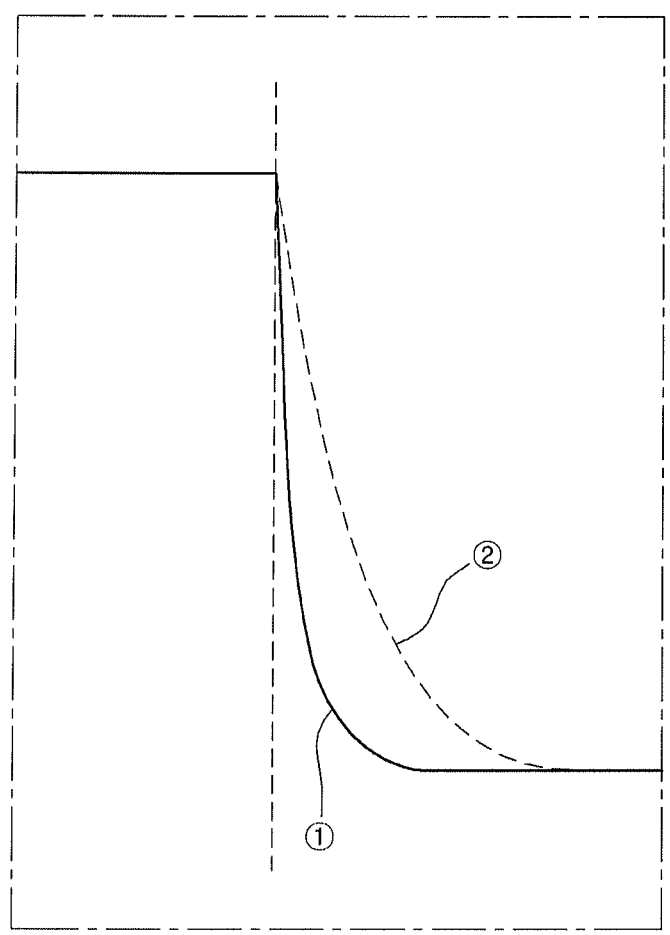
FIG. 7 is a waveform diagram illustrating a falling edge characteristic of the gate pulse which is output from each of the gate drivers according to first and second embodiments of the present disclosure.

The above-mentioned connection configuration may reduce the delay of the falling time of the gate pulse, as shown in FIG. 7. In FIG. 7, ① is a falling curve of the gate pulse generated by the second embodiment, and ② is a falling curve of the gate pulse generated by the first embodiment.

In the LCD device of the second embodiment, the gate electrode of the nth compensation transistor is connected to the n+4 gate line in the adjacent region to the (n+4)th stage. As such, the gate low voltage may be promptly applied to the nth gate line without any time delay when the gate high voltage is output from the (n+4)th stage. Actually, the distance between the gate electrode of the nth compensation transistor and the (n+4) stage in the second embodiment may become smaller than that of the first embodiment. In accordance therewith, the signal delay due to the resistance of the (n+4)th gate line may be prevented, and the gate low voltage may be more rapidly applied to the nth gate line. Therefore, the delay of the falling time of the gate pulse may be prevented or minimized, and furthermore image quality may be enhanced.

Figure 8:
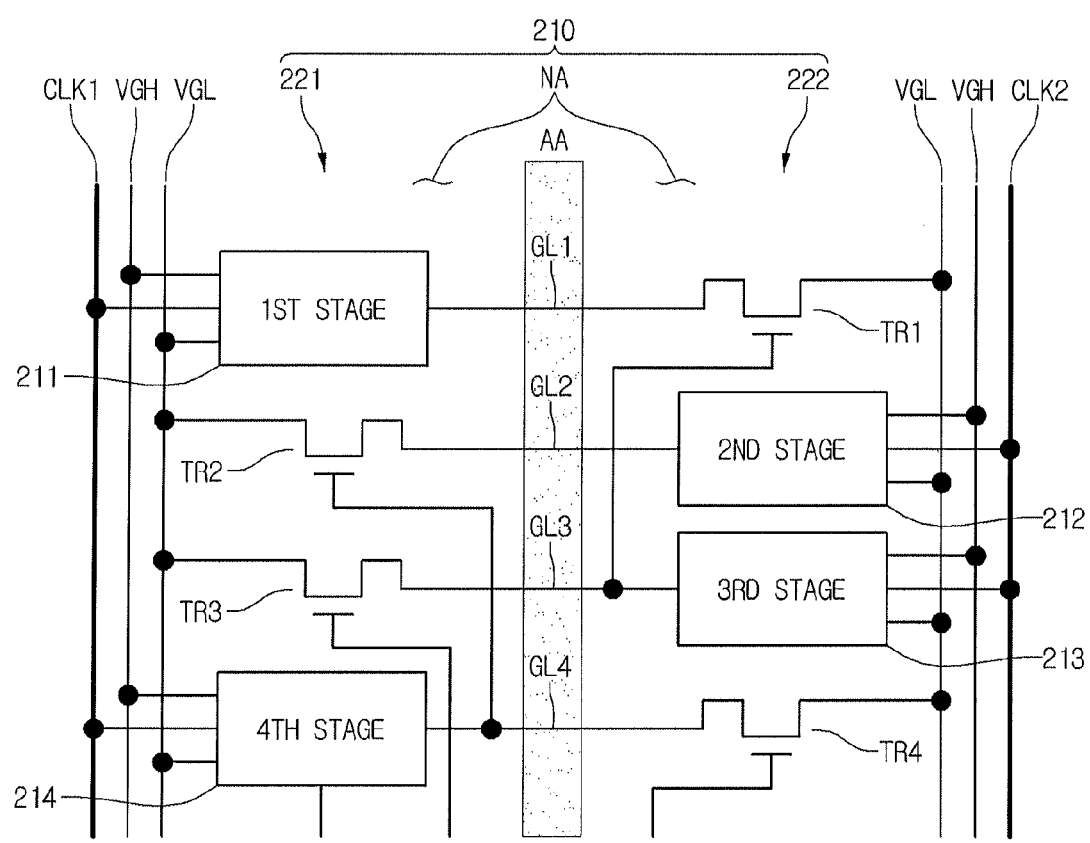
FIG. 8 is a detailed circuit diagram showing a gate driver according to a third embodiment of the present disclosure.

FIG. 8 is a detailed circuit diagram showing a gate driver according to a third embodiment of the present disclosure.

The gate driver of the LCD device according to a third embodiment of the present disclosure may realize an overlapping drive mode which sequentially applies the gate high voltage to the gate lines in two horizontal synchronous intervals with having a time difference of a single horizontal synchronous interval. As such, the gate driver of the third embodiment has the same configuration as that of the first embodiment with the exception of positional alternation of the stages and the compensation transistors. Therefore, the description of the third embodiment overlapping with the first embodiment will be omitted.

Referring to FIG. 8, the LCD panel 1 of the LCD device according to a third embodiment of the present disclosure may be defined into the display area AA and the non-display area NA. The non-display area NA may be positioned outside the display area AA.

The gate driver 210 may be formed on the non-display area NA. The gate driver 210 may include the first and second gate drivers 221 and 222. The gate driver 210 may include a plurality of stages. Although it is explained that the gate driver 210 includes first through fourth stages 211 through 214 as shown in the drawing, the gate driver 210 is not limited to this.

(4k−3)th and (4k−2)th stages of the plurality of stages may be disposed in the left and right sides with having the display area AA therebetween. The term "k" is a natural number. Also, (4k) th and (4k−1)th stages of the plurality of stages may be disposed in the left and right sides with having the display area AA therebetween. As such, the (4k−1)th stage may be disposed under the (4k−2) stage.

Referring now to the drawing, the first stage 211 and the second stage 212 may be disposed in the left and right sides with having the display area AA. The third stage 213 and the fourth stage 214 may also be disposed in the right and left sides with having the display area AA therebetween. As such, the third stage 213 may be disposed under the second stage 212.

The first gate driver 221 may include the (4k−3)th stage and the (4k)th stage. The second gate driver 222 may include the (4k−2)th stage and the (4k−1)th stage.

In other words, the first gate driver 221 may include the first stage 211 and the second stage 212. The second gate driver 222 may include the third stage 213 and the fourth stage 214.

The first gate driver 221 may further include the first clock line CLK1, the first voltage line VGH and the second voltage line VGL. The second gate driver 221 may further include the second clock line CLK2, the first voltage line VGH and the second voltage line VGL.

A plurality of compensation transistors may be formed in regions opposite to the plurality of stages. The first compensation transistor TR1 may be connected to the first stage 211 through the first gate line GL1. The second compensation transistor TR2 may be connected to the second stage 212 through the second gate line GL2. The third compensation transistor TR3 may be connected to the third stage 213 through the third gate line GL3. The fourth compensation transistor TR4 may be connected to the fourth stage 214 through the fourth gate line GL4.

The (4k−2)th and (4k−1)th compensation transistors of the compensation transistors may be included in the first gate driver 221. The (4k−3)th and (4k)th compensation transistors of the compensation transistors may be included in the second gate driver 222. For example, the first gate driver 221 may include the second and third compensation transistors TR2 and TR3, and the second gate driver 222 may include the first and fourth compensation transistors TR1 and TR4.

A gate electrode of the nth compensation transistor may be electrically connected to (n+2)th gate line which is connected to the (n+2)th stage. In other words, the gate electrode of the nth compensation transistor may be electrically connected to the (n+2) gate line in an adjacent region to the (n+2)th stage. For example, a gate electrode of the first compensation transistor TR1 may be electrically connected to a third gate line GL3 in an adjacent region to the third stage 213.

In this manner, the gate electrode of the nth compensation transistor may be electrically connected to the (n+2)th gate line which is connected to the (n+2)th stage. As such, the gate driver 210 may drive the gate lines in the overlapping drive mode which allows the gate high voltage to be sequentially applied to the gate lines in two horizontal synchronous intervals with having a time difference corresponding to a single horizontal synchronous interval.

Also, the gate electrode of the nth compensation transistor may be electrically connected to the (n+2)th gate line in the adjacent region to the (n+2)th stage. As such, the gate low voltage may be promptly applied to the kth gate line without any time delay at a time point at which when the gate high voltage is applied from the (n+2)th stage to the (n+2)th gate line. In accordance therewith, the delay of the falling time of the gate pulse may be prevented or minimized, and furthermore image quality may be enhanced.

The LCD panels according to the present embodiments allow the stages included in the gate driver to be arranged in one of a Z shape and an inverse-Z shape. Also, the LCD panel enable the compensation transistors to be connected the gate lines in adjacent regions to the different stages which are opposite to the respective stages. As such, the delay of the falling time of the gate pulse being caused by the resistance-capacitance delay on the gate line may be prevented or minimized. Therefore, image quality may be enhanced.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A display panel, the display panel comprising:
   a plurality of gate lines;
   a first clock line and a second clock line; and
   a gate driver configured to include a plurality of stages connected to the plurality of gate lines, wherein the plurality of stages are grouped into a plurality of first numbered stages that are connected to the first clock line on one end and a corresponding compensation transistor on another end such that a display area is positioned between a first numbered stage and a corresponding compensation transistor, and a plurality of second numbered stages that are connected to the second clock line on one end and a corresponding compensation transistor on another end such that a display area is positioned between a second numbered stage and a corresponding compensation transistor.

2. The display panel of claim 1, wherein the plurality of stages are grouped into a first stage group comprised of a first numbered stage and a second numbered stage connected in an alternating manner, and a second stage group comprised of a first numbered stage and a second numbered stage connected in an alternating manner.

3. The display panel of claim 2, wherein a gate electrode of a kth compensation transistor in the first stage group is configured to be electrically connected to a kth gate line in the second stage group.

4. The display panel of claim 2, wherein a last stage of the first stage group is a second numbered stage, and the first stage of the second stage group is a second numbered stage such that the second stage group follows the first stage group.

5. The display panel of claim 2, wherein a high voltage is provided to a gate line included in the first stage group for a number of horizontal synchronous intervals that corresponds to a number of stages in the first stage group.

6. The display panel of claim 2, wherein a high voltage supplied from a first stage of the second stage group is supplied to a corresponding compensation transistor of a first stage of the first stage group.

7. The display panel of claim 6, wherein the high voltage supplied from the first stage of the second stage group is provided from a node between the first stage of the second stage group and a display area.

8. The display panel of claim 6, wherein the high voltage supplied from the first stage of the second stage group is provided from a node between a display area and a non-display area.

9. The display panel of claim 6, wherein the high voltage supplied to the corresponding compensation transistor of the first stage of the first stage group turns on the corresponding compensation transistor.

10. The display panel of claim 9, wherein a low voltage is supplied to a gate line corresponding to the first stage of the first stage group if the corresponding compensation transistor of the first stage of the first stage group is turned on.

11. The display panel of claim 1, further comprising:
    a first gate driver configured on a first side of the display area and a second gate driver configured on a second side of the display area that is opposite to the first side, wherein the first gate driver comprises the first clock line used to transfer a clock signal;
    a first voltage line used to transfer a high voltage; and
    a second voltage line used to transfer a low voltage.

12. The display panel of claim 11, wherein the second gate driver comprises the second clock line used to transfer a clock signal;

a first voltage line used to transfer the gate high voltage; and a second voltage line used to transfer the gate low voltage.

13. A method of driving a display panel, comprising:

configuring a gate driver to include a plurality of stages connected to a plurality of gate lines, wherein the plurality of stages are grouped into a plurality of first numbered stages and a plurality of second numbered stages;

driving the first numbered stages, the first numbered stages including a first clock line on one end and a corresponding compensation transistor on another end wherein a display area is positioned between a first numbered stage and a corresponding compensation transistor, and driving the second numbered stages, the second numbered stages including a second clock line on one end and a corresponding compensation transistor on another end such wherein a display area is positioned between a second numbered stage and a corresponding compensation transistor.

14. The method of claim 13, further comprising:

driving a first stage group comprised of a first numbered stage and a second numbered stage connected in an alternating manner, and driving a second stage group comprised of a first numbered stage and a second numbered stage connected in an alternating manner.

15. The method of claim 14, wherein driving the first stage group comprises driving a last stage of the first stage group that is a second numbered stage, and wherein driving the second stage group comprises driving a first stage of the second stage group that is a second numbered stage, wherein the second stage group follows the first stage group.

16. The method of claim 14, wherein driving the first and second stage groups comprises driving a gate electrode of a kth compensation transistor in the first stage group that is electrically connected to a kth gate line in the second stage group.

17. The method of claim 14, wherein driving the first stage group comprises driving a gate line included in the first stage group with a high voltage for a number of horizontal synchronous intervals that corresponds to a number of stages in the first stage group.

18. The method of claim 14, wherein driving the first and second stage groups comprises driving a first stage of the second stage group to supply a high voltage to a corresponding compensation transistor of a first stage of the first stage group.

19. The method of claim 18, wherein the high voltage supplied from the first stage of the second stage group is provided from a node between the first stage of the second stage group and a display area.

20. The method of claim 18, wherein the high voltage supplied from the first stage of the second stage group is provided from a node between a display area and a non-display area.

* * * * *